(12) United States Patent
Matsuyuki et al.

(10) Patent No.: US 10,420,226 B2
(45) Date of Patent: Sep. 17, 2019

(54) YTTRIA-SENSITIZED ZIRCONIA

(71) Applicant: Apple Inc., Cupertino, CA (US)

(72) Inventors: Naoto Matsuyuki, Tokyo-to (JP); Dale N. Memering, Langhorne, PA (US); Theodore A. Waniuk, Lake Forest, CA (US); Kazuya Takagi, Tokyo-to (JP); Colin M. Ely, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 295 days.

(21) Appl. No.: 15/614,747

(22) Filed: Jun. 6, 2017

(65) Prior Publication Data

US 2018/0079686 A1     Mar. 22, 2018

Related U.S. Application Data (60) Provisional application No. 62/397,678, filed on Sep. 21, 2016.

(51) Int. Cl.
*H05K 5/00* (2006.01)
*B32B 1/02* (2006.01)
(Continued)

(52) U.S. Cl.
CPC .............. *H05K 5/0004* (2013.01); *B24C 1/04* (2013.01); *B24C 1/06* (2013.01); *B24C 1/08* (2013.01); *B24C 11/00* (2013.01); *C04B 35/486* (2013.01); *C04B 41/009* (2013.01); *C04B 41/53* (2013.01); *C04B 41/91* (2013.01); *H01L 23/06* (2013.01); *H04M 1/0202* (2013.01); *H04M 1/18* (2013.01); *H04M 1/185* (2013.01); *H05K 5/0017* (2013.01); *H05K 5/02* (2013.01);
(Continued)

(58) Field of Classification Search
CPC ...... H05K 5/0004; H05K 5/0017; H05K 5/02; H05K 5/0247; H01L 23/06; H04M 1/18; H04M 1/185; B32B 1/02
See application file for complete search history.

(56) References Cited

U.S. PATENT DOCUMENTS

| 4,764,491 A | 8/1988 | Quadir |
| 4,833,001 A | 5/1989 | Kijima et al. |

(Continued)

FOREIGN PATENT DOCUMENTS

| EP | 0826645 | 3/1998 |
| EP | 1857428 | 11/2007 |

(Continued)

OTHER PUBLICATIONS

Siqueira et al., "Poly(borosiloxanes) as Precursors for Carbon Fiber Ceramic Matrix Composites," http://www.scielo.br/scielo.php?script=sci_arttext&pid=S1516-14392007000200009, Materials Research, vol. 10, No. 2, São Carlos, Apr./Jun. 2007.

(Continued)

*Primary Examiner* — Walter Aughenbaugh
(74) *Attorney, Agent, or Firm* — Dorsey & Whitney LLP (57) ABSTRACT

A housing for a portable electronic device is disclosed. The housing is composed of yttria-sensitized zirconia. Yttria-sensitized zirconia has from about 1.5 to about 2.5 mole percent yttria, and more typically about 2 mole percent yttria, and most typically 2 mole percent yttria, in zirconia. Yttria-sensitized zirconia is both tough and able to limit the formation and propagation of micro-cracks. Methods for manufacturing yttria-sensitized zirconia composed housings are also disclosed.

20 Claims, 9 Drawing Sheets

(51) Int. Cl.
   *H04M 1/18*      (2006.01)
   *H01L 23/06*     (2006.01)
   *H05K 5/02*      (2006.01)
   *H04M 1/02*      (2006.01)
   *B24C 1/04*      (2006.01)
   *C04B 41/91*     (2006.01)
   *C04B 35/486*    (2006.01)
   *B24C 1/06*      (2006.01)
   *B24C 1/08*      (2006.01)
   *B24C 11/00*     (2006.01)
   *C04B 41/00*     (2006.01)
   *C04B 41/53*     (2006.01)

(52) U.S. Cl.
   CPC .... *H05K 5/0247* (2013.01); *C04B 2235/3225* (2013.01); *C04B 2235/76* (2013.01); *C04B 2235/765* (2013.01); *C04B 2235/963* (2013.01); *H04M 1/0283* (2013.01)

(56) References Cited

U.S. PATENT DOCUMENTS

| | | | |
|---|---|---|---|
| 4,857,093 A | 8/1989 | Prewo et al. | |
| 6,133,181 A | 10/2000 | Wentworth et al. | |
| 8,076,011 B2 | 12/2011 | Chiang et al. | |
| 8,251,210 B2 | 8/2012 | Schmidt et al. | |
| 8,298,975 B2 | 10/2012 | Hasegawa et al. | |
| 8,322,560 B2 | 12/2012 | Jiang et al. | |
| 8,394,167 B2 | 3/2013 | Merkel et al. | |
| 8,442,604 B1 | 5/2013 | Diebel | |
| 8,563,644 B2 | 10/2013 | Imada et al. | |
| 8,781,109 B2 | 7/2014 | Hong | |
| 9,007,747 B2 | 4/2015 | Gandhi | |
| 9,011,997 B2 | 4/2015 | Weber | |
| 9,448,713 B2 | 9/2016 | Cruz-Hernandez et al. | |
| 9,516,150 B2 | 12/2016 | Jeon et al. | |
| 2009/0197048 A1 | 8/2009 | Amin et al. | |
| 2010/0003479 A1 | 1/2010 | Hwang et al. | |
| 2013/0108813 A1 | 5/2013 | Zhu | |
| 2013/0224454 A1 | 8/2013 | Jung et al. | |
| 2013/0316116 A1 | 11/2013 | Adams et al. | |
| 2014/0178642 A1 | 6/2014 | Milanovska et al. | |
| 2015/0010721 A1 | 1/2015 | Tanida et al. | |
| 2015/0246459 A1 | 9/2015 | Dorn et al. | |
| 2016/0089811 A1 | 3/2016 | Matsuyuki et al. | |
| 2016/0090326 A1 | 3/2016 | Matsuyuki et al. | |
| 2016/0255929 A1 | 9/2016 | Nazzaro et al. | |
| 2016/0347674 A1 | 12/2016 | Meschke et al. | |
| 2017/0075039 A1 | 3/2017 | Hart et al. | |
| 2017/0088473 A1 | 3/2017 | Wilson et al. | |
| 2017/0300114 A1 | 10/2017 | Matsuyuki et al. | |
| 2017/0361067 A1 | 12/2017 | Nazzaro et al. | |

FOREIGN PATENT DOCUMENTS

| | | |
|---|---|---|
| EP | 2243756 | 10/2010 |
| EP | 2266934 | 12/2010 |
| WO | WO 16/043378 | 3/2016 |

OTHER PUBLICATIONS

U.S. Appl. No. 15/098,836, filed Apr. 14, 2016, Matsuyuki et al.
U.S. Appl. No. 15/371,121, filed Dec. 6, 2016, Ely et al.
U.S. Appl. No. 15/611,329, filed Jun. 1, 2017, Ely et al.

FIG. 10

YTTRIA-SENSITIZED ZIRCONIA

CROSS-REFERENCE TO RELATED APPLICATION

This application claims the benefit under 35 U.S.C. § 119(e) of U.S. Provisional Patent Application No. 62/397,678, filed on Sep. 21, 2016, and entitled "Yttria-Sensitized Zirconia," the contents of which are incorporated by reference as if fully disclosed herein.

FIELD

The described embodiments relate generally to yttria-sensitized zirconia. More particularly, the present embodiments relate to housings for portable electronic devices composed of yttria-sensitized zirconia.

BACKGROUND

Portable electronic devices are becoming smaller, more lightweight and more powerful. These same devices have a continued requirement for high durability and reliability. In order to obtain these device design requirements, it may be beneficial to develop a housing that is thinner, lighter, and more durable. Embodiments described herein are directed to electronic device housings that are formed from ceramic materials and, in particular, zirconia.

SUMMARY

Various embodiments described herein encompass toughened, micro-crack resistant housings for portable electronic devices. Housings herein show equivalent toughness to stress induced loads as do conventional yttria-stabilized zirconia housings. However, housing herein show an increased sensitivity toward the prevention and propagation of micro-cracking, particularly as compared to conventional yttria-stabilized housings. This ability of housings in accordance with embodiments herein to limit micro-crack induced damage is a significant and unexpected advantage to the electronics industry.

Embodiments described herein take advantage of the amount of monoclinic phase zirconia present in a housing, where a useful level of this phase of zirconia allows the housing to avoid and limit damage, while not effecting the overall toughness of the housing, as provided by the tetragonal phase of zirconia. This combination of the monoclinic and tetragonal phases of zirconia provides a significant advancement in housings for use in electronic devices.

In one embodiment, an enclosure for an electronic device is described. The enclosure has a housing body defining an opening, where the housing body is composed of zirconia and from 1.5 mole percent yttria to 2.5 mole percent yttria. The housing body is attached to a cover, such that the housing body and cover define an enclosed volume. An exterior surface of the housing body is polished and has a first amount of monoclinic crystals therein, while an interior surface of the housing body is roughened. The roughened interior surface of the housing body has a second amount of monoclinic crystals, such that the second amount of monoclinic crystals is greater than the first amount of monoclinic crystals.

In some aspects, the housing body includes an internal portion located between the interior surface and exterior surface and includes tetragonal phase zirconia, while the interior and exterior surfaces of the body include a combination of monoclinic and tetragonal phase zirconia. In other aspects, the interior surface is roughened to form a surface roughness of from about 0.05 to 0.4 µm. In still other aspects, the roughened surface is formed over a stress-prone region(s) that have an increased likelihood of experiencing elevated stress as compared to other regions of the housing body. Further, the housing body can be composed of zirconia and 2 mole percent yttria.

Enclosures herein can include a housing body that defines a bottom portion surrounded by multiple sidewalls, and can enclose, in conjunction with the cover, a volume configured to receive a display and multiple electronic components. In some cases the enclosure is for a wearable electronic device or a mobile phone.

In other embodiments, an electronic device is described that includes a housing with an exterior surface and an interior surface. The housing is composed of yttria-sensitized zirconia. The electronic device also includes a display positioned within the housing, and a cover positioned over the display. The interior surface of the housing contains a higher percentage zirconia monoclinic crystals than the exterior surface of the housing. In some aspects, the yttria-sensitized zirconia is composed of zirconia and from 1.5 mole percent to 2.5 mole percent yttria. In other aspects, the yttria-sensitized zirconia is composed of zirconia and 2 mole percent yttria. The exterior surface of the housing can be polished, while the interior surface can have an increased resistance to micro-fracture propagation, particularly as compared to the exterior surface. In some cases, the internal portion of the housing includes tetragonal phase zirconia.

Embodiments also include methods for forming a housing for an electronic device. A first operation includes forming a housing substrate composed of yttria-sensitized zirconia. The housing substrate having an interior surface and an exterior surface. A second operation includes polishing at least a portion of the exterior surface of the housing, while a third operation includes roughening at least a portion of the interior surface to induce a phase shift in the yttria-sensitized zirconia to produce an increased amount of monoclinic crystals as compared to the exterior surface.

Aspects of the method for forming a housing include a yttria-sensitized zirconia composed of zirconia and from 1.5 mole percent yttria to 2.5 mole percent yttria. Also, the exterior surface and interior surface of the housing substrate can have a greater amount of monoclinic crystals as compared to an internal portion of the housing substrate located between the exterior and interior surfaces. Finally, the roughening of the portion of the interior surface of the housing substrate may increase the resistance to micro-crack propagation as compared to the exterior surface of the housing substrate. The roughening of the interior surface can result in a surface roughness having an Ra from 0.05 to 0.4 µm.

Finally, embodiments include methods where the roughening is performed by blasting the interior surface of the housing substrate with alumina particles, and the polishing is performed by applying a diamond resin pad to the exterior surface.

BRIEF DESCRIPTION OF THE DRAWINGS

The disclosure will be readily understood by the following detailed description in conjunction with the accompanying drawings, wherein like reference numerals designate like structural elements, and in which.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, they are intended to cover alternatives, modifications, and equivalents as can be included within the spirit and scope of the described embodiments as defined by the appended claims.

The embodiments described herein are generally directed to housings and housing components that are formed from a ceramic material that is specially formulated to increase the toughness and durability of the device. In some embodiments, the housing is formed from a zirconia material. Zirconia ($ZrO_2$) is a chemically unreactive material with low thermal conductivity and high strength, making it an attractive material. However, pure zirconia is unstable at room temperature due to its various polymorphs (cubic, tetragonal and monoclinic), each having a different temperature requirement for stability and each having a different crystal structure volume. Pure zirconia may be combined with larger ions, like yttria, hafnia, alumina, and magnesia, to improve the materials stability. Doped zirconia materials may be referred to herein as "stabilized" zirconia.

Stabilized zirconia (e.g., zirconia that includes a larger volume ions) typically exhibits greater crystal structure stability at room temperature, than pure zirconia, and can be a favored material for use in portable electronic devices, particularly the housings of portable electronic devices. However, some forms of yttria-stabilized zirconia exhibit micro-fracturing or failure by cracking when sufficient and/or repeated stress is applied The following disclosure relates to yttria-sensitized zirconia (as opposed to yttria-stabilized zirconia), and more particularly, to yttria-sensitized zirconia for use in housings, or other enclosures, of portable electronic devices. Yttria-sensitized zirconia is zirconia that includes yttria at an amount or mole percentage that both provides increased crystal stability and toughness to the zirconia but also limits and reduces or mitigates micro-crack propagation along the surface of the zirconia. As such, housings formed from yttria-sensitized zirconia and having various surface treatments, as described herein, may provide unexpected and surprising benefits for various enclosures, particularly for housings of portable electronic devices.

Although not bound by a theory on how yttria-sensitized zirconia functions, the content of yttria in zirconia affects the materials stability and toughness, as well as the sensitivity of the material to damage formation and propagation. Compound doping or addition (like doping in the semiconductor industry) of zirconia, by a larger ion (larger than zirconia), affects all three phases of the zirconia polymorphs: cubic, tetragonal and monoclinic. Toughness and stability of zirconia is based on having a sufficient quantity of larger ion compound doped in the zirconia to stabilize the tetragonal polymorph of zirconia at room temperature. The tetragonal structure of zirconia is strongest among the three crystal structures, and the formation of zirconia tetragonal crystals allows materials to withstand load induced stresses.

However, as described herein, it may be beneficial to reduce the stability of the tetragonal phase in order to induce the formation of monoclinic crystal material along the surface of the zirconia. A target amount of yttria can be added to the zirconia to add enough stability to the zirconia that it remains stable and tough, but is also able to resist damage and increase a resistance to micro-crack propagation. Yttria-sensitized zirconia may include zirconia with from about 1.5 mole percent yttria to about 2.5 mole percent yttria. In some cases, yttria-sensitized zirconia results from a sufficient quantity of monoclinic crystals being present in the material to push or swell into the crack sites, while not interfering with the overall stability/toughness of the material. The expansion of monoclinic zirconia into the micro-cracks limits both micro-crack formation and propagation by physically filling the space. The filled space limits expansion of the micro-crack and often eliminates further spreading of the micro-crack. In some cases, the propensity for the zirconia to experience a phase shift at the site of a micro-crack can be described as an increase in material "sensitivity."

Embodiments herein include enclosures, housings, or housing components (e.g., housing bodies or housing substrates) for portable electronics formed from yttria-sensitized zirconia. Housings herein enclose and support various components of the portable electronic device, for example, the device circuitry and support components. Housing components may be composed of yttria-sensitized zirconia to improve the durability of the electronic device.

In some embodiments, housings formed from yttria-sensitized zirconia may be treated through media blasting (or other like procedure) to further sensitize the housing surface. Media blasting of the yttria-sensitized zirconia surface may improve the resistance of the surface to micro-crack propagation without significantly affecting the toughness or strength of the housing. In some instances, media blasting transforms the blasted yttria-sensitized surface to include a higher concentration or percentage of monoclinic phase zirconia, thereby increasing the resistance to micro-crack propagation or otherwise reducing the likelihood of failure by micro-crack propagation. The media blasting may be performed over regions that have an increased likelihood of experiencing elevated stress as compared to other regions of the housing. In this way, the housing may be selectively toughened based on the design of the structure and anticipated stress loading.

In some embodiments herein the housing has a flat portion surrounded by one or more walls that may be curved or contoured in shape. On the interior surface, the region where the flat portion gives way to the walls defines an edge and typically four corners where the walls meet. Portions of the interior surface of the housing can be blasted with particles to increase the toughness or resistance to crack propagation, particularly along the edges and corners where crack formation is anticipated. In some aspects, the entire interior surface can be media blasted, such that the entire surface, has an increased resistance to micro-crack propagation. In still other aspects, the exterior surface of the housing can be polished, where the housing's increased resistance to crack propagation (due to reduced phase stability caused by appropriate amounts of yttria doping) limits the expansion and propagation of micro-cracks formed during the polishing procedure.

Media blasting of the interior surface, and polishing of the exterior surface, can be performed on the same housing, for example, a housing may have an exterior surface polished and an interior surface media blasted. Media blasting of the interior surface, and polishing of the exterior surface, do not need to be practiced on the same housing. However, aspects of the present enclosure envision housings having only the exterior surface polished or only the interior surface media blasted. In some embodiments, media blasting is not performed on the exterior surface, as media blasting can have a detrimental effect on the housing's aesthetics (although, where aesthetics are not a concern, or where a textured look is required, media blasting can be performed on both the interior and exterior surfaces). In typical embodiments, polishing of the interior surface of yttria-sensitized zirconia is not required.

Embodiments herein also include methods for preparing portable electronic device housings composed of yttria-sensitized zirconia. Aspects include preparing a yttria-sensitized zirconia, that is roughly equivalent or comparable in toughness to yttria-stabilized zirconia, but is also responsive to physical damage, and in particular, limits or reduces the likelihood of propagation of micro-cracking or damage to the surfaces of the housing. Housings are formed by doping, in a mole percent, zirconia with yttria to an appropriate combination to form a yttria-sensitized zirconia. The yttria-doped zirconia is heated to a melting temperature for both components, thoroughly mixed, and allowed to cool. In some embodiments, the combination is made under heat and pressure as would be required for isostatic pressing. The housing is formed from the zirconia and yttria combination and a proper housing forming procedure.

Housing embodiments in accordance with the present disclosure surround, support and protect the internal components of a portable electronic device, for example, integrated circuit chips, circuitry, structural elements, and the like. The housing typically has a contour and physical appearance of the portable electronic device. Example portable electronic devices in accordance with embodiments herein include: mobile phones, portable media players, portable computing devices, tablet computers, notebook computers, and so on. In some embodiments, a portable electronic device includes a wearable electronic device including, for example, a smart watch, a timekeeping device (e.g., an electronic watch), a health-monitoring device, a wrist-worn device, and so on. Yttria-sensitized zirconia housings can be formed by isostatic pressing, molding with quenching, forging, and other known techniques. Typical embodiments utilize isostatic pressing the yttria-sensitized zirconia into the desired housing shape.

These and other embodiments are discussed below with reference to FIGS. 1-10. However, those skilled in the art will readily appreciate that the detailed description given herein with respect to these Figures is for explanatory purposes only and should not be construed as limiting.

Figure 1:
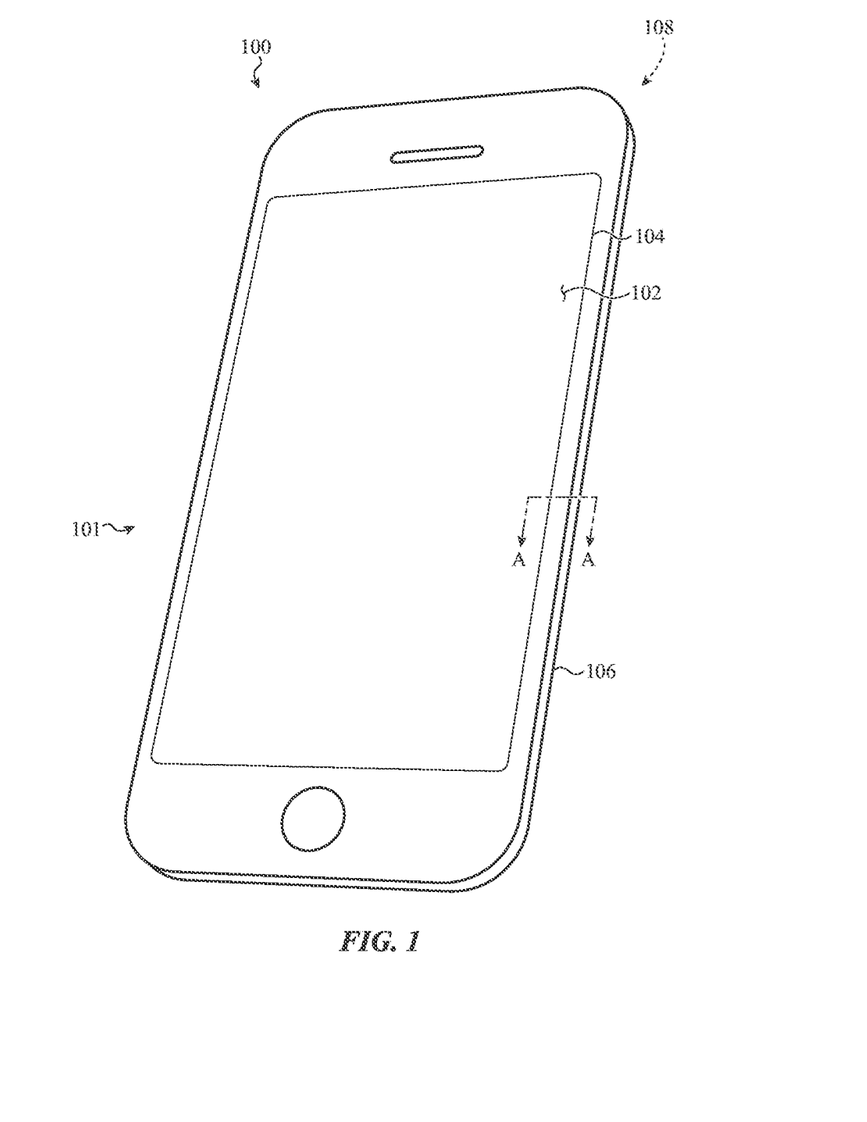
FIG. 1 shows an electronic device having a housing in accordance with embodiments herein.

FIG. 1 illustrates one embodiment of a portable electronic device 100. The portable electronic device 100 (or device 100) includes an enclosure 101 formed by a housing body 106 (e.g., a housing) and a cover 102. In the present embodiment, the housing body 106 is formed from yttria-doped (e.g., yttria-sensitized) zirconia. In accordance with embodiments described herein, the yttria-doped zirconia may have a composition and surface treatments that exhibit an improved toughness and increase resistance to cracking as compared to other zirconia or ceramic-based housings.

The enclosure 101 includes a housing body 106 and cover 102 that together define an interior volume that is configured to house or enclose the various electronic components of the device 100. For example, the housing body 106 may define an opening in which the display 104 is positioned. The cover 102 is positioned over the display 104 and forms a portion of the exterior surface of the device 100. The display may include a liquid crystal display (LCD), an organic light-emitting diode (OLED) display, or other suitable display element or component. The cover 102 may be formed from a transparent substrate including, for example, a glass sheet, sapphire sheet, and/or a polymer material.

In accordance with embodiments herein, the housing body 106 may formed from yttria-sensitized zirconia. The yttria-sensitized zirconia is tough and resists stress caused by a load force, similar to some conventional yttria-stabilized zirconia. However, yttria-sensitized zirconia may be formulated to facilitate a phase change of the yttria more readily as compared to other traditional formulations. The ability to react or induce a phase change along the surface of the housing 106 may result in an increased resistance to the formation and expansion of micro-fractures or micro-cracks in and along the surface of the housing body 106.

In some instances, the improved resistance to crack propagation results in an increase in toughness and/or durability of the housing 106. For example, the zirconia formulation, alone or in combination with surface treatment techniques described herein, may improve the ability of the housing body 106 to survive an impact, repeated loading, temperature variation, and other events that typically contribute to the expansion of micro-fractures or micro-cracks. For purposes of this disclosure, environmental events or conditions includes most forms of impact, handling, temperature cycling and use that a portable electronic device may undergo.

For embodiments herein, housings are composed of yttria-sensitized zirconia. Yttria-sensitized zirconia typically includes zirconia doped to from about 1.5 to about 2.5 mole percent yttria, and more typically to about 2 mole percent yttria, and most typically, to 2 mole percent yttria. For purposes herein, doping is the process of adding one element, in this case yttria, to another element, in this case zirconia. The term is used in a broad sense of adding yttria until a certain mole percent of the compound in reached in a starting amount of zirconia (a mole percent being a mole fraction of a component multiplied by 100, and a mole fraction being the number of moles of the component divided by the total number of moles in the mixture).

Figure 2:
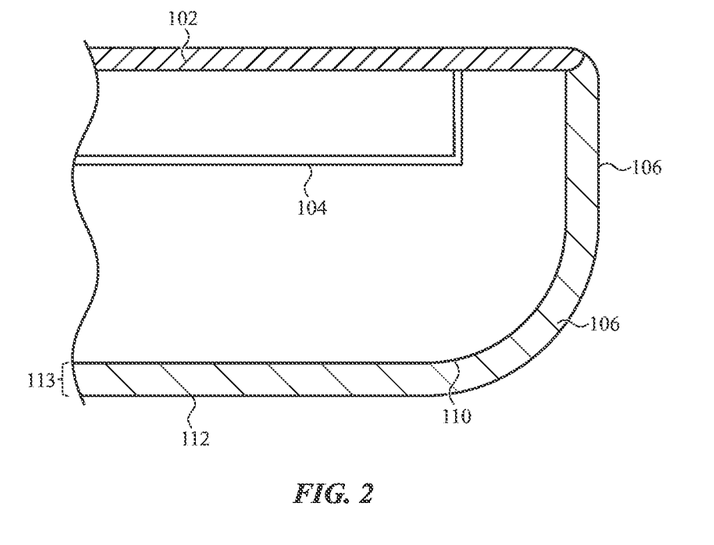
FIG. 2 is a cross-sectional view of an enclosure in accordance with embodiments herein.

FIG. 2 is a cross-sectional view of an enclosure 101 along section A-A in FIG. 1. In particular, FIG. 2 shows an enclosure 101 including a housing body 106 composed of yttria-sensitized zirconia. As shown in FIG. 2, the housing body 106 defines an opening. The cover 102 is attached to the housing body 106 to cover the opening and define an enclosed volume. Within the enclosed volume, the housing body 106 includes an interior surface 110. External to the enclosed volume, the housing body 106 includes an exterior surface 112. Between the interior surface 110 and the exterior surface 112 is an internal portion 116 that forms the internal structural portion of walls of the housing body 106. The walls of the housing body 106 may have a thickness (as shown by ref numeral 113) of less than 10 mm, more typically less than 8 mm, still more typically less than 6 mm, and most typically less than 3 mm. The thickness of the walls may be uniform across the entirety of its surface, although variations in thickness may be necessary or advisable in some embodiments.

Figure 6:
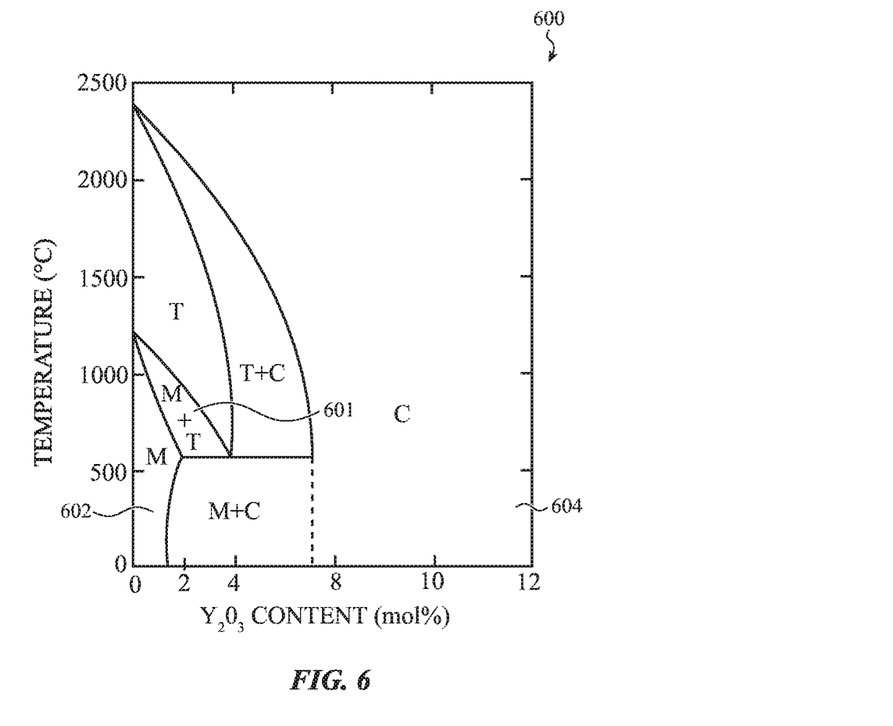
FIG. 6 shows a zirconia phase diagram, where yttria is at a content between 0 and 12 mole percent.

The interior surface 110 of the housing includes a surface portion that can be media blasted to form a roughened surface, the roughened surface showing enhanced resistance to micro-crack propagation (see FIG. 6). The exterior surface 112 of the housing can be polished to present a highly refined glossy look. The yttria-sensitized zirconia may limit or reduce the formation and propagation of micro-cracks, as compared to yttria-stabilized zirconia and other conventional housing materials. In some cases, the improved mechanical properties of the yttria-sensitized zirconia is due to an increased percentage of monoclinic crystals or material along the interior surface 110 as compared to within the internal portion 116, which may be formed from primarily tetragonal phase zirconia. In some cases, the interior surface 110 has an increased percentage of monoclinic crystals as compared to the exterior surface 112.

Figure 3:
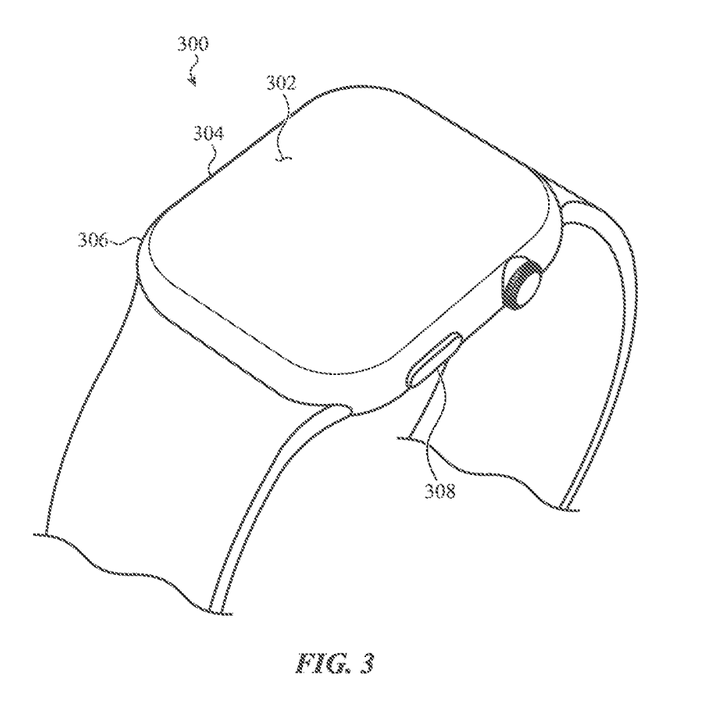
FIG. 3 shows a wearable device having a housing in accordance with embodiments herein.

FIG. 3 shows an alternative embodiment of a portable electronic device, in this case a wearable device. The wearable device 300 includes an enclosure 304 formed by a housing body 306 (e.g., a housing) and a cover 302. In the present embodiment, the housing body 306 is formed from yttria-doped (e.g., yttria-sensitized) zirconia. In accordance with embodiments described herein, the yttria-doped zirconia may have a composition and surface treatments that exhibit an improved toughness and increase resistance to cracking as compared to other zirconia or ceramic-based housings.

A display is mounted on the housing and may be a touch screen display. The device may include one or more buttons 308 useful in gathering user input. The buttons may be dome switches or other switch circuitry. The device may also include a speaker port, data ports, and an audio connector port.

Figure 4A:
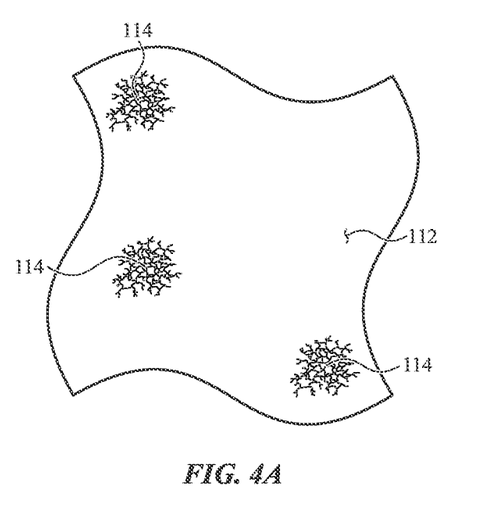
FIG. 4A is an detailed view of a housing surface.

FIG. 4A shows a plain view of an exterior surface 112 of a conventional yttria-stabilized zirconia housing after polishing. Polishing stress on the conventional housing material has introduced several micro-cracks 114 that can then propagate into larger and deeper damage. Conventional yttria-stabilized zirconia, or other like materials are tough and resist load stress, but tend to have little of the reactive monoclinic crystal zirconia phase. As such, the micro-cracks formed from polishing may continue to form and propagate in and along the surface of the material until ultimately the surface shows visible damage.

Figure 4B:
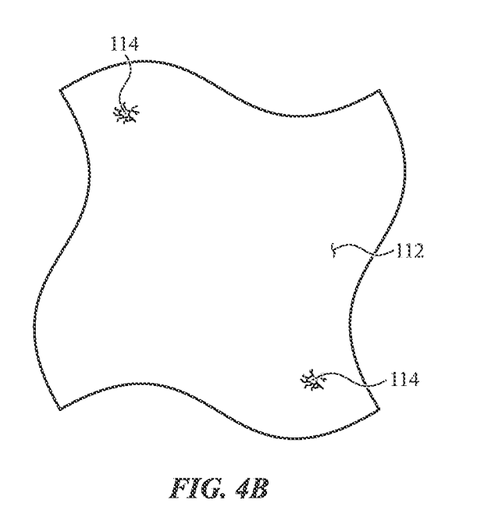
FIG. 4B is an detailed view of a housing surface in accordance with embodiments herein.

FIG. 4B shows a plain view of an exterior surface 112 of a yttria-sensitized zirconia housing after polishing. Polishing stress may induce or form a few micro-cracks 114, but these cracks may propagate to a lesser extent and, thus, be minimized in size and depth as compared to the same surface shown in FIG. 4A. As such, the yttria-sensitized zirconia housing body 106 may provide a significant benefit over the yttria-stabilized zirconia.

Figure 5:
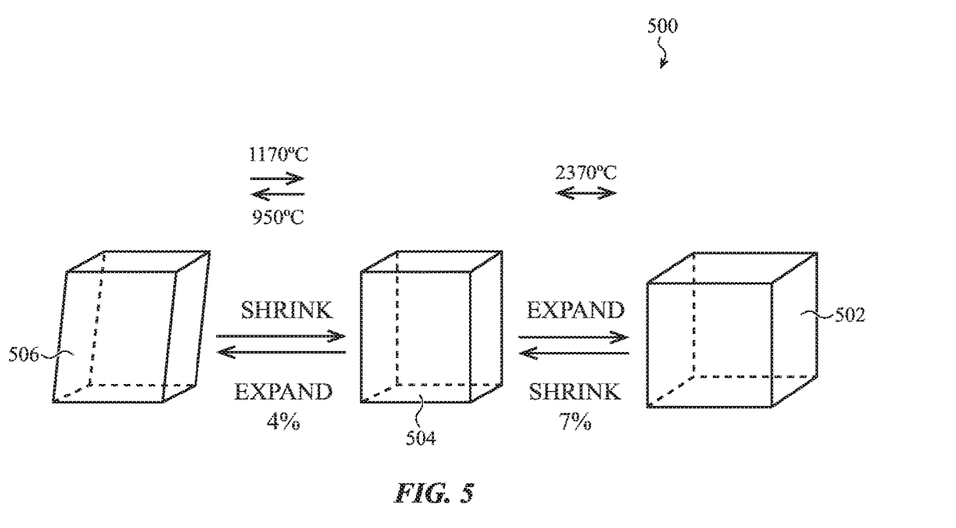
FIG. 5 shows a schematic of the three phases of zirconia.

FIG. 5 shows the phase transformation of the three crystal phases of zirconia 500. As shown in the diagram, at temperatures above 2370° C., zirconia is found in a cubic crystal structure or phase 502. The cubic structure 502 has low fracture toughness and is not advantageous for use in zirconia based materials. At temperatures between about 1170° C. and 2370° C., zirconia is predominately in a tetragonal crystal structure or phase 504. The tetragonal structure 504, when stabilized at room temperature via doping, provides the highest fracture toughness of the three phases. The tetragonal crystal structure 504 takes up 7% less volume than the cubic structure 502. At temperatures below 1170° C., zirconia is in a monoclinic crystal structure or phase 506. The monoclinic structure 506 shows an expansion of 4% volume over the tetragonal structure 504. Pure zirconia, at room temperature, is in the monoclinic crystal structure, and is of limited toughness and durability.

Some yttria-stabilized zirconia may include 3-7 mole percent yttria, which transforms the monoclinic zirconia into a material that exhibits predominately the tetragonal zirconia crystal structure. Here, $Zr^{4+}$ is replaced with $Y^{3+}$, oxygen vacancies are added, and ionic conductivity is increased. Such yttria-stabilized zirconia may be significantly tougher than pure zirconia (monoclinic), and of zirconia with higher amounts of yttria (10, 20, 30 mol %, etc.), where a significant portion of the zirconia is stabilized as the tetragonal crystal structure. Such yttria-stabilized zirconia is highly stable at room temperature (room temperature being between about 19° C. and 25° C.), being almost entirely composed of the tetragonal phase. Note, as discussed above, the tetragonal crystal phase is may be insensitive or unreactive to preventing and limiting micro-fracture formation and propagation in the housing substrate.

While some formulations seek to stabilize the tetragonal zirconia crystal structure, in some embodiments, it may be beneficial to reduce the stability of the crystalline structure in order to promote phase change into the larger volume monoclinic crystalline structure along the surface of the component or substrate. In particular, formulations that include approximately 1.5 to 2.5 mole percent yttria, and more typically about 2 mole percent yttria, and most particularly, 2 mole percent yttria, in zirconia, may yield a toughness comparable to traditional stabilized zirconia, but has an added benefit of enhanced damage protection. Embodiments herein show that housings composed of yttria-sensitized zirconia significantly limit micro-crack formation and propagation, i.e., where damage occurs due to micro-crack stress, the yttria-sensitized zirconia limits or prevents further development. This is a benefit not found in some other formulations of yttria-stabilized zirconia, which may have a reduced ability to limit or prevent micro-crack propagation.

FIG. 6 is a zirconia phase diagram showing the zirconia phase based on yttria content and temperature 600. Note that between 1.5 and 2.5 yttria mole percent, both the monoclinic and tetragonal crystal phases are present 601. It is the amount of monoclinic phase of zirconia present that allows for the increased resistance to micro-crack formation and propagation. However, where the amount of monoclinic phase is too great, the zirconia begins to loose toughness, for example below 1.5 mole percent yttria 602, and where the yttria content is above 7 mole percent, the zirconia becomes predominately cubic and of more limited use 604.

Figure 7A:
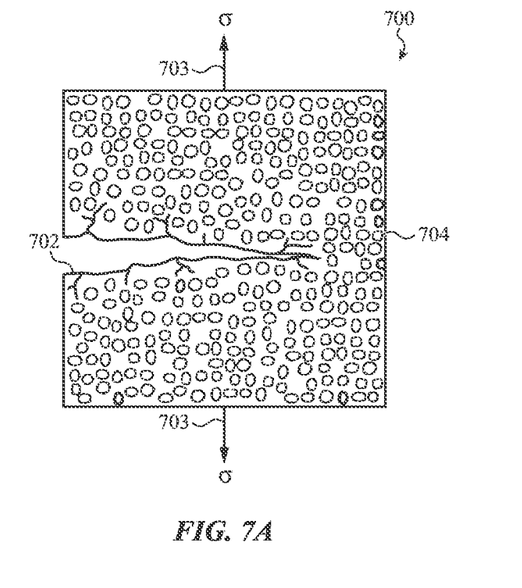
FIG. 7A shows a yttria-stabilized zirconia surface with a stress induced micro-fracture and tetragonal response.

FIG. 7A illustrates yttria-stabilized zirconia component 700 where the ratio of yttria to zirconia keeps the zirconia in the tetragonal phase (due, for example, to the presence of 3 to 7 mole percent yttria). The tetragonal crystals 704 may be extremely tough and provide a tough surface, resistant to load 703 and other related stress. However, polishing and other micro-crack forming events, when formed in a conventional yttria-stabilized zirconia, can be problematic as the yttria-stabilized zirconia is less able to prevent micro-crack formation and propagation 702. This material is unresponsive when damage in the surface occurs, and micro-cracking expands to cracking over time. These events can have a major impact on the surfaces durability and reliability.

Figure 7B:
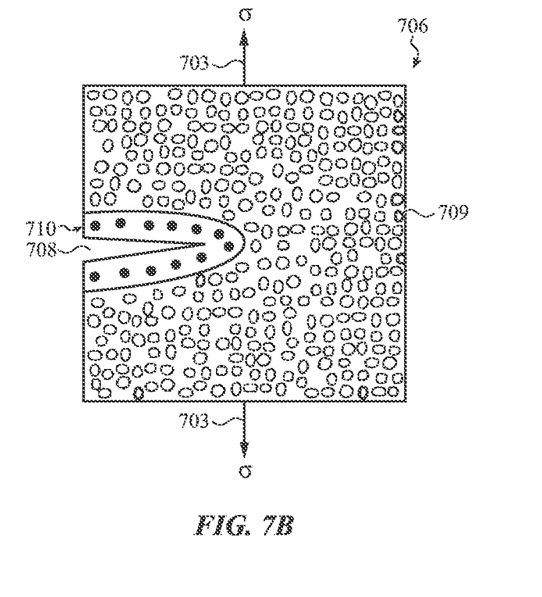
FIG. 7B shows a yttria-sensitized zirconia surface with a stress induced micro-fracture and tetragonal and monoclinic crystal responses.

FIG. 7B illustrates a yttria-sensitive zirconia component 706 in accordance with embodiments herein. The yttria-sensitive zirconia component 706 may include a percentage of the zirconia in the monoclinic crystal phase. The monoclinic crystals 710 may be formed or induced by a phase change along the surface of the zirconia component 706 due to the formation of the crack 708. The monoclinic crystals 710, having a larger volume, may tend to swell or expand along the crack 708 forming a localized compressive stress. The localized compressive stress caused by the monoclinic crystals 710 may arrest or suppress the propagation of the crack 708.

The formation of the monoclinic crystals 710 may be promoted or enhanced by using a yttria-sensitive zirconia composition in accordance with embodiments described herein. In particular, the composition may include approximately 1.5 to 2.5 mole percent yttria, and more typically about 2 mole percent yttria. Additionally, because the yttria-sensitive zirconia component 706 includes tetragonal phase crystals 709, the component 706 may have a similar or comparable strength and toughness as compared to other types of yttria-stabilized zirconia. As such, yttria-sensitized zirconia may be an unexpectedly useful material for housings for portable electronic devices, showing the surfaces durability and reliability.

Figure 8:
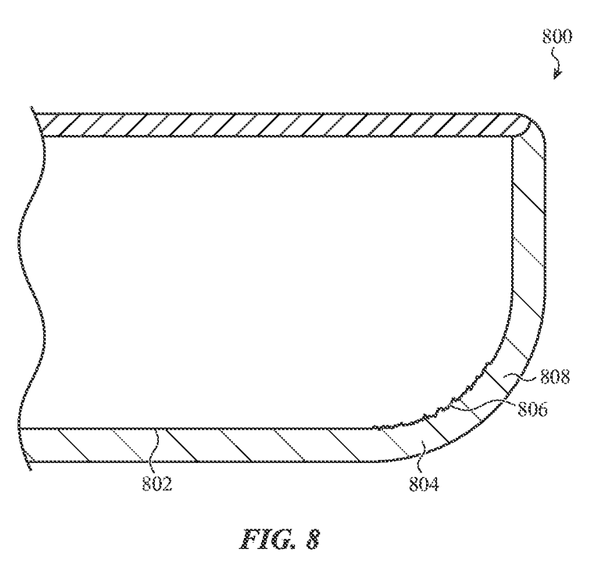
FIG. 8 is a cross-sectional schematic view of a housing having an interior surface with a portion roughened according to an embodiment herein.

FIG. 8 is an illustrative cross-sectional schematic view of a yttria-sensitized housing in accordance with embodiments herein 800. The interior surface 802 of the housing 804 shows a media blasted surface 806 in accordance with an embodiment herein. A curved sidewall 808 was roughened using alumina beads such that the surface exhibited an Ra of from about 0.05 to about 0.4 μm. In some cases, the surface is roughened to have an Ra from about 0.08 to about 0.35 μm. In other embodiments, the surface is roughened to have an Ra from 0.1 μm to about 0.3 μm. The roughened portion 806 of the interior surface shows enhanced monoclinic content and therefore enhanced resistance to micro-crack propagation.

Roughened surfaces can be added to areas within the interior where micro-cracks or damage may occur, for example, from dropping the portable device on one end of the device. In some cases, the roughened surfaces are formed over a stress-prone region of the housing 804 having an increased likelihood of experiencing elevated stress as compared to other regions of the housing 804. For example, the roughened surfaces may be formed along edges, corners, or other stress-concentrating features of the housing 804 that are likely to experience an elevated level of stress.

Figure 9:
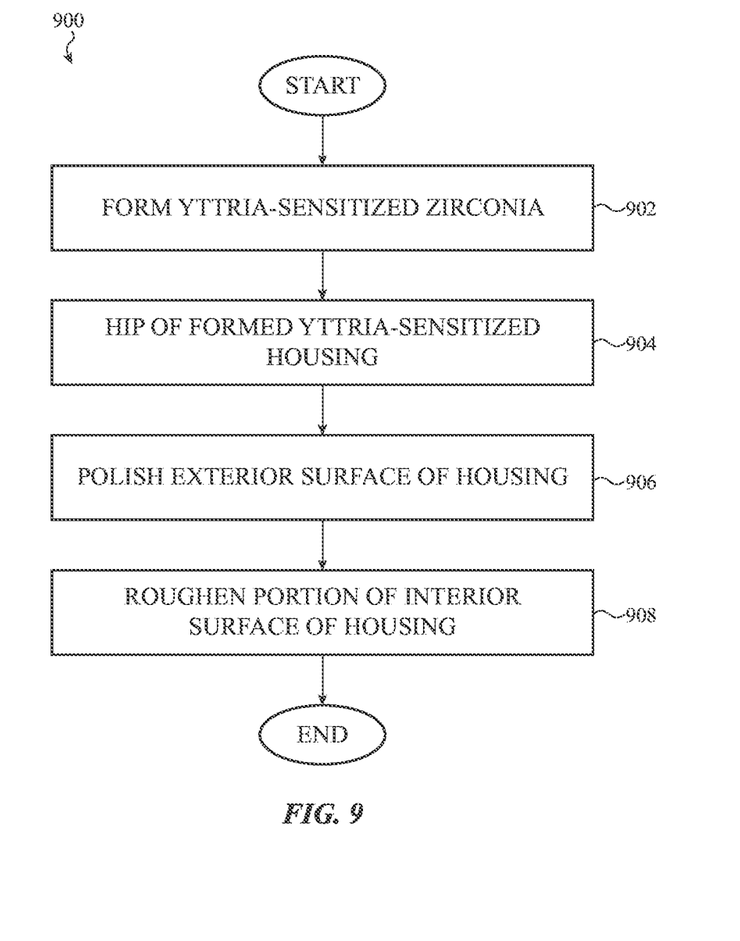
FIG. 9 shows a flow diagram for preparing a yttria-sensitized zirconia housing in a portable electronic device.

FIG. 9 is a flow diagram for the preparation of a housing composed of a housing substrate of yttria-sensitized zirconia for use in portable electronic device 900. The housing substrate, composed of yttria-sensitized zirconia, is formed from zirconia having from about 1.5 to 2.5 mole percent yttria, and more typically about 2 mole percent yttria, and most typically 2 mole percent yttria 902. The yttria-sensitized zirconia housing substrate is formed with an exterior and interior surface, in one embodiment, by combining the zirconia and yttria via Hot Isostatic Pressing 904. Method embodiments also include polishing some or all of the exterior surface of the housing. Polishing can include, for example, a hard polish using a diamond resin pad 906.

The housing substrate is then integrated into the manufacturing of a portable electronic device, for example, a mobile phone or wearable device. In some embodiments, some or all of the interior surface of the housing substrate is media blasted using alumina particles to form a roughened surface (0.08 to 0.35 μm) 908. Aspects can include only blasting portions of the interior surface where damage is more likely, for example at the corners.

Figure 10:
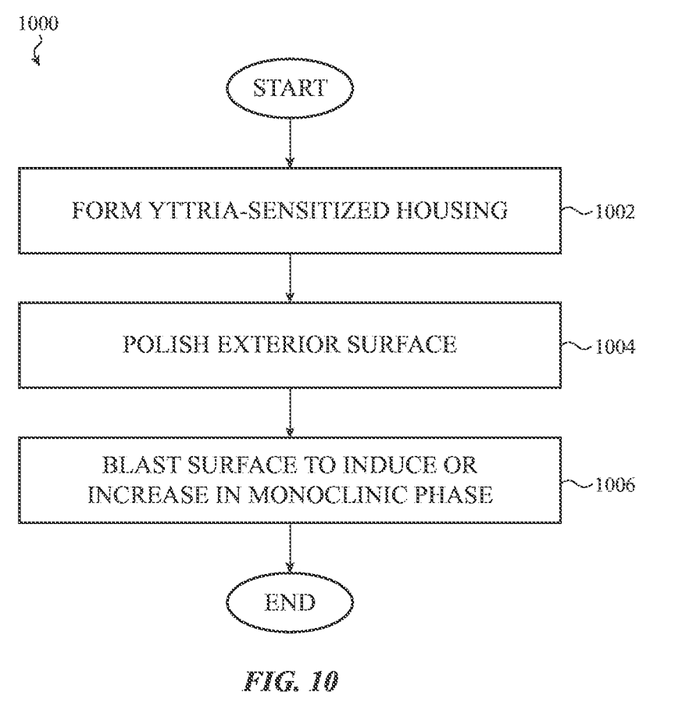
FIG. 10 shows a flow diagram for preparing the interior surface of a housing substrate for increased resistance to micro-crack propagation or damage.

FIG. 10 is a flow diagram of another embodiment for the preparation of a housing composed of a yttria-sensitized zirconia for use in portable electronic device 1000. As above, the housing is formed using yttria-sensitized zirconia shaped to a desired portable electronic housing or other like enclosure 1002. Dependent on the type of housing, and its use, portions of the housing that require additional resistance to micro-fracture formation and/or propagation are identified. For example, along the edge where the wall and flat portion of the housing meet, or the corners of the interior surface, and the like. Method embodiments also include polishing some or all of the exterior surface of the housing. Polishing can include, for example, a hard polish using a diamond resin pad 1004. The surface is then blasted using media blasting or other like procedure to produce a surface roughness of from 0.08 μm to 0.35 μm, and in some embodiments, 0.1 μm to 0.3 μm 1006. The blasting allows for the roughened surface to transform some amount of the tetragonal phase of zirconia to the monoclinic phase of zirconia. The increase in monoclinic phase zirconia makes the blasted surface more reactive or sensitive to potential damage. Blasting of the interior surface of the housing is typically useful for preventing micro-fracture formation due to impact or other like event.

EXAMPLES

Yttria-Sensitive Zirconia Is Tough and Damage Resistant

Gardner energy testing was performed on 3 mole percent yttria-stabilized zirconia (3Y) and 2 mole percent yttria-sensitized zirconia (2Y). The tested surface for both the 3Y and 2Y were hard polished using a diamond resin pad. After polishing the surface, an Ra for the 3Y surface was 0.082 μm and for the 2Y, 0.1 μm. A series of three impact tests were performed on each of the 3Y and 2Y materials, showing that the 2Y had a significantly increased Gardner Energy requirement to cause observable damage to the surface. In particular, the 2Y showed impact damage at 1.75 J, while the 3Y showed damage at 0.85 J. Gardner Energy measuring the amount of energy on impact required to damage or fail the material.

Fracture force testing or RoR testing was also performed on the same 3Y and 2Y materials. The force required to fracture the polished 3Y specimen was close to 9,000 N, while the 2Y specimen showed a fracture force of 8,100 N. Fracture force testing tests the fracture toughness of a material, essentially a measure of how much energy is required to fracture a material.

As such, the polished 2Y material is able to withstand a great deal more impact before being damaged, than the 3Y. However, the 2Y and 3Y show equivalent toughness with regard to the amount of force required to fracture the materials.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An enclosure for an electronic device comprising:
   a housing body defining an opening and composed of zirconia and from 1.5 mole percent yttria to 2.5 mole percent yttria;
   a cover attached to the housing body and covering the opening to define an enclosed volume; wherein:
   a first surface of the housing body is polished;
   the first surface has a first amount of monoclinic crystals;
   at least a portion of a second surface of the housing body is roughened; and
   the second surface has a second amount of monoclinic crystals that is greater than the first amount.

2. The enclosure of claim 1, wherein:
   an internal portion of the housing body located between the first and second surfaces includes tetragonal phase zirconia; and
   the first and second surfaces include a combination of monoclinic and tetragonal phase zirconia.

3. The enclosure of claim 1, wherein the at least a portion of the second surface of the housing body is roughened to form a roughened surface having a surface roughness Ra from about 0.05 to about 0.4 μm.

4. The enclosure of claim 3, wherein the roughened surface is formed over a stress-prone region having an increased likelihood of experiencing elevated stress as compared to other regions of the housing body.

5. The enclosure of claim 1, wherein the housing body is composed of zirconia and 2 mole percent yttria.

6. The enclosure of claim 1, wherein the housing body defines a bottom portion having multiple sidewalls extending therefrom.

7. The enclosure of claim 1, wherein the enclosed volume is configured to receive a display and multiple electronic components.

8. The enclosure of claim 1, wherein the electronic device is a wearable electronic device or a mobile phone.

9. An electronic device comprising:
   a housing having an exterior surface and an interior surface, the housing composed of yttria-sensitized zirconia;
   a display positioned within the housing; and
   a cover positioned over the display; wherein
   the interior surface of the housing contains a higher percentage of zirconia monoclinic crystals than the exterior surface of the housing.

10. The electronic device of claim 9, wherein the yttria-sensitized zirconia is composed of zirconia and from 1.5 mole percent to 2.5 mole percent yttria.

11. The electronic device of claim 9, wherein the yttria-sensitized zirconia is composed of 2 mole percent yttria.

12. The electronic device of claim 9, wherein the exterior surface is polished.

13. The electronic device of claim 9, wherein the interior surface of the housing exhibits an increased resistance to micro-fracture propagation as compared to the exterior surface of the housing.

14. The electronic device of claim 9, wherein an internal portion of the housing located between the interior and exterior surfaces includes tetragonal phase zirconia.

15. A method of forming a housing substrate for an electronic device, comprising:
   forming a housing substrate composed of yttria-sensitized zirconia, the housing substrate having an interior surface and an exterior surface;
   polish at least a portion of the exterior surface; and
   roughen at least a portion of the interior surface to induce a phase shift in the yttria-sensitized zirconia and produce an increased amount of monoclinic crystals as compared to the exterior surface.

16. The method of claim 15, wherein the yttria-sensitized zirconia is composed of zirconia and from 1.5 mole percent yttria to 2.5 mole percent yttria.

17. The method of claim 15, wherein the exterior surface and interior surface have a greater amount of monoclinic crystals as compared to an internal portion of the housing substrate located between the exterior and interior surfaces.

18. The method of claim 15, wherein roughening the portion of the interior surface of the housing substrate increases a resistance to micro-crack propagation as compared to the exterior surface of the housing substrate.

19. The housing of claim 15, wherein the roughened portion of the interior surface results in a surface roughness having an Ra from 0.05 to 0.4 μm.

20. The method of claim 15, wherein:
   the roughening is performed by blasting the interior surface with alumina particles; and
   the polishing is performed by applying a diamond resin pad to the exterior surface.

* * * * *